US008591654B2

(12) United States Patent
Kitou et al.

(10) Patent No.: US 8,591,654 B2

(45) Date of Patent: Nov. 26, 2013

(54) DEVICE FOR MANUFACTURING SIC SINGLE CRYSTAL AND METHOD FOR THE SAME

(75) Inventors: Yasuo Kitou, Okazaki (JP); Jun Kojima, Iwakura (JP)

(73) Assignee: DENSO CORPORATION, Kariya (JP)

( * ) Notice: Subject to any disclaimer, the term of this patent is extended or adjusted under 35 U.S.C. 154(b) by 633 days.

(21) Appl. No.: 12/289,415

(22) Filed: Oct. 28, 2008

(65) Prior Publication Data

US 2009/0107394 A1 Apr. 30, 2009

(30) Foreign Application Priority Data

Oct. 31, 2007 (JP) ................................ 2007-283408

(51) Int. Cl.

| | |
|---|---|
| ***C30B 35/00*** | (2006.01) |
| ***C30B 23/00*** | (2006.01) |
| ***C23C 16/00*** | (2006.01) |
| ***B05C 11/00*** | (2006.01) |

(52) U.S. Cl.

USPC ............ 117/200; 117/102; 118/715; 118/714

(58) Field of Classification Search

None

See application file for complete search history.

(56) References Cited

U.S. PATENT DOCUMENTS

| | | | | |
|---|---|---|---|---|
| 4,309,240 A * | 1/1982 | Zaferes | ......................... | 438/488 |
| 5,360,760 A | 11/1994 | Hayashi | | |
| 6,770,137 B2 | 8/2004 | Hara et al. | | |
| 7,217,323 B2 | 5/2007 | Sugiyama et al. | | |
| 2004/0194694 A1 * | 10/2004 | Sugiyama et al. | ............ | 117/200 |
| 2011/0155048 A1 | 6/2011 | Kojima | | |

FOREIGN PATENT DOCUMENTS

| | | |
|---|---|---|
| JP | 2003 002795 A * | 1/2003 |
| JP | A-2003-183098 | 7/2003 |
| JP | A-2006-193384 | 7/2006 |

OTHER PUBLICATIONS

Search Report issued on Mar. 10, 2010 by the European Patent Office in corresponding European Application No. 08018331.2-1215/ 2055813.

* cited by examiner

*Primary Examiner* — Bijay Saha

(74) *Attorney, Agent, or Firm* — Posz Law Group, PLC

(57) ABSTRACT

A device for manufacturing a SiC single crystal includes: a raw material gas introduction pipe; a raw material gas heat chamber having a raw material gas supply passage for heating the gas in the passage; a reaction chamber having a second sidewall, an inner surface of which contacts an outer surface of a first sidewall of the heat chamber, and having a bottom, on which a SiC single crystal substrate is arranged; and a discharge pipe in a hollow center of the raw material gas heat chamber. The supply passage is disposed between an outer surface of the discharge pipe and an inner surface of the first sidewall. The discharge pipe discharges a residual gas, which is not used for crystal growth of the SiC single crystal.

10 Claims, 3 Drawing Sheets

PULL UP
10 10b 10c 13 6a 6 14 1 2 10a 2a 2a 12 2b 2b 8d 8c 8 8a 8b 9b 9a 9 11 7 7a 4 11 3

DEVICE FOR MANUFACTURING SIC SINGLE CRYSTAL AND METHOD FOR THE SAME

CROSS REFERENCE TO RELATED APPLICATION

This application is based on Japanese Patent Application No. 2007-283408 filed on Oct. 31, 2007, the disclosure of which is incorporated herein by reference.

FIELD OF THE INVENTION

The present invention relates to a device for manufacturing SiC single crystal and a method for manufacturing SiC single crystal.

BACKGROUND OF THE INVENTION

A technique for growing SiC single crystal from gas as raw material is disclosed in JP-B2-3941727 corresponding to U.S. Pat. No. 7,217,323. A device for manufacturing SiC single crystal in JP-B2-3941727 is shown in FIG. 3.

In the device, a heat coil J2 is arranged around a vacuum chamber J1. The inside of the chamber J1 is vacuumed through a discharge pipe J3. Further, raw material gas J5 for SiC material is introduced in the chamber J1 through a gas introduction pipe J4. Thus, a SiC single crystal ingot J9 is grown on a SiC single crystal substrate J8 as a seed crystal, which is disposed in a reaction chamber J7. The reaction chamber J7 is disposed inside of heat insulating material J6. The raw material gas J5 introduced from the gas introduction pipe J4 is heated and decomposed in a raw material gas heating chamber J10. The heating chamber J10 has a hollow center, and is disposed on an introduction port of the gas introduction pipe J4. The raw material gas J5 is supplied to the substrate J8 through the hollow center of the heating chamber J10. Residual raw material gas, which is not used for the crystal growth, is flown through an opening passage J11, which is provided by clearance between the sidewall of the heating chamber J10 and the inner wall of the reaction chamber J7. Then, the residual raw material gas is discharged through the discharge pipe J3 so that the gas is evacuated to the outside of the vacuum chamber J1.

The ingot J9 has the maximum diameter, which is substantially equal to the inner diameter of the reaction chamber J7.

In the above device, it is necessary to form sufficiently wide opening passage J11 for discharging the residual raw material gas J5. Specifically, the clearance between the inner wall of the reaction chamber J7 and the outer wall of the heating chamber J10 is sufficiently widened. Further, it is necessary to form the sidewall of the heating chamber J10 having the sufficiently large thickness for heating and decomposing the raw material gas J5. Thus, the raw material gas J5 is mainly supplied to the center of the substrate 38, so that the center of the ingot J9 is rapidly grown. Thus, the growth rate at the center of the ingot J9 is larger than that at the periphery of the ingot J9. As a result, the surface of the ingot J9 becomes a convex shape. The diameter of the ingot J9 is smaller than the diameter of the substrate J8, and thereby, the process yield becomes low.

JP-A-2002-154898 corresponding to U.S. Pat. No. 6,770,137 teaches that the inner diameter of the sidewall of the heating chamber J10 becomes larger toward the substrate J9, so that the inner wall of the heating chamber J10 has a tapered surface. Thus, the area, to which the raw material gas J5 is supplied, is widened, and the diameter of the ingot J9 increases.

When the inner wall of the heating chamber J10 has the tapered surface, the position of the inner wall of the heating chamber J10 becomes far from the coil J2 as the position approaches toward the gas introduction pipe J4. Thus, the raw material gas J5 is not sufficiently heated by the coil J2, so that the raw material gas J5 is not sufficiently decomposed.

Thus, it is required to increase the diameter of the ingot and to improve the process yield of the SiC single crystal.

SUMMARY OF THE INVENTION

In view of the above-described problem, it is an object of the present disclosure to provide a device for manufacturing a SiC single crystal. It is another object of the present disclosure to provide a method for manufacturing a SiC single crystal.

According to a first aspect of the present disclosure, a device for manufacturing a SiC single crystal includes: a raw material gas introduction pipe introducing a raw material gas, which provides crystal growth of the SiC single crystal; a raw material gas heat chamber having a cylindrical shape with a hollow center, wherein the hollow center of the raw material gas heat chamber provides a raw material gas supply passage, the cylindrical shape of the raw material gas heat chamber provides a first sidewall, the raw material gas supply passage flows the raw material gas introduced from the raw material gas introduction pipe, and the raw material gas heat chamber heats the raw material gas when the raw material gas flows through the raw material gas supply passage; a reaction chamber having a cylindrical shape with a bottom, wherein the cylindrical shape of the reaction chamber provides a second sidewall, an inner surface of the second sidewall contacts an outer surface of the first sidewall so that the bottom of the reaction chamber is disposed opposite to the raw material gas heat chamber, and a SiC single crystal substrate as a seed crystal is arranged on the bottom of the reaction chamber so that the raw material gas heated by the raw material gas heat chamber is supplied to the SiC single crystal substrate; and a discharge pipe disposed in the hollow center of the raw material gas heat chamber. The raw material gas supply passage is disposed between an outer surface of the discharge pipe and an inner surface of the first sidewall, and the discharge pipe discharges a residual gas of the raw material gas, which is not used for the crystal growth of the SiC single crystal.

Since the discharge pipe is arranged in the raw material gas heat chamber, the raw material gas flows from an outer side of the reaction chamber to a center of the reaction chamber. Thus, the raw material gas is supplied in a large area of a growth surface of a SiC single crystal ingot. The ingot has a large diameter, and the product yield of the ingot is improved.

According to a second aspect of the present disclosure, a method for manufacturing a SiC single crystal includes: preparing a raw material gas heat chamber having a cylindrical shape with a hollow center, wherein the hollow center of the raw material gas heat chamber provides a raw material gas supply passage, and the cylindrical shape of the raw material gas heat chamber provides a first sidewall; arranging a reaction chamber over the raw material gas heat chamber, wherein the reaction chamber has a cylindrical shape with a bottom, and the cylindrical shape of the reaction chamber provides a second sidewall; contacting an inner surface of the second sidewall on an outer surface of the first sidewall so that the bottom of the reaction chamber is disposed opposite to the raw material gas heat chamber; arranging a SiC single crystal substrate as a seed crystal on the bottom of the reaction chamber; arranging a discharge pipe in the hollow center of the raw material gas heat chamber, wherein the raw material gas supply passage is disposed between an outer surface of the discharge pipe and an inner surface of the first sidewall; heating a raw material gas with the raw material gas heat chamber when the raw material gas flows through the raw material gas supply passage, wherein the raw material gas provides crystal growth of the SiC single crystal; supplying the raw material gas to the SiC single crystal substrate through the raw material gas supply passage so that a SiC single crystal ingot is formed on the SiC single crystal substrate; and discharging a residual gas of the raw material gas through the discharge pipe, the residual gas which is not used for the crystal growth of the SiC single crystal. The raw material gas flows from an outer periphery of the SiC single crystal substrate to a center of the SiC single crystal substrate.

In the above method, the raw material gas flows from an outer side of the reaction chamber to a center of the reaction chamber. Thus, the raw material gas is supplied in a large area of a growth surface of a SiC single crystal ingot. The ingot has a large diameter, and the product yield of the ingot is improved.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF EXAMPLE EMBODIMENTS

Figure 1:
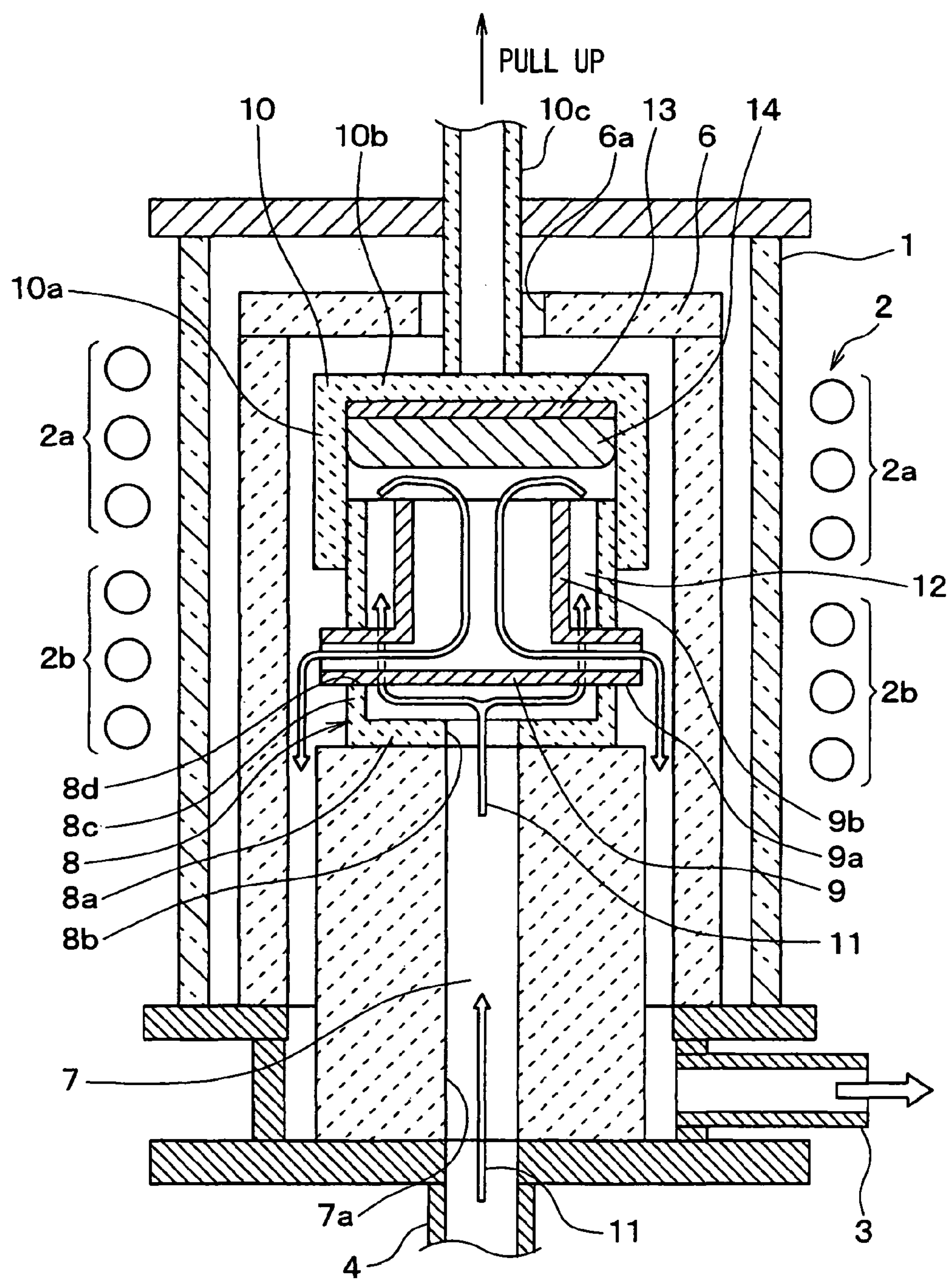
FIG. 1 is a diagram illustrating a cross sectional view of a device for manufacturing a SiC single crystal.

FIG. 1 shows a device for manufacturing a SiC single crystal.

The device includes a vacuum chamber 1, a heat coil 2, a first discharge pipe 3, a raw material gas introduction pipe 4, a first heat insulating member 6, a second heat insulating member 7, a raw material gas heat chamber 8, a second discharge pipe 9 and a reaction chamber 10.

Figure 3:
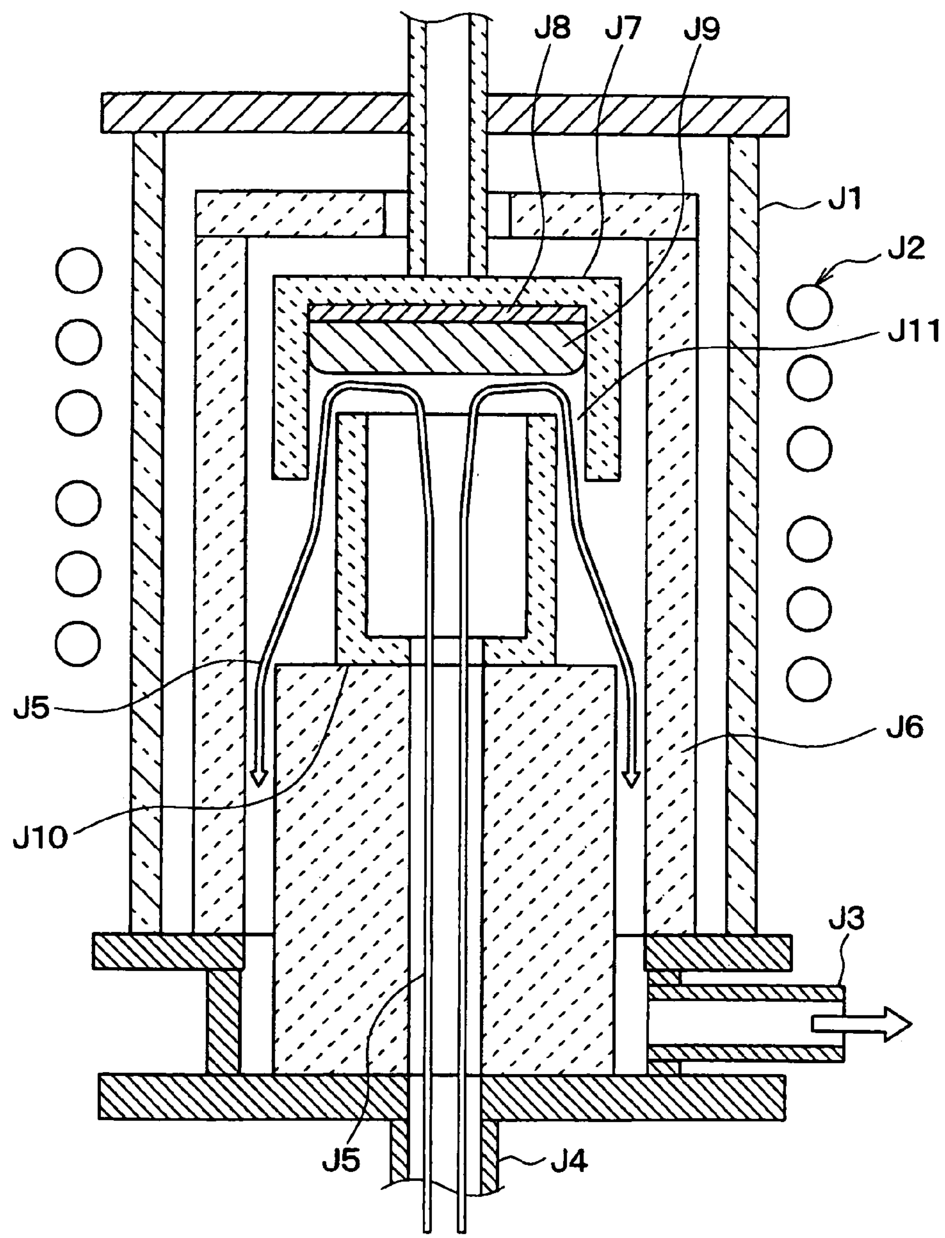
FIG. 3 is a diagram illustrating a cross sectional view of a conventional device for manufacturing a SiC single crystal.

The vacuum chamber 1 is made of, for example, quartz. The vacuum chamber 1 has a cylindrical shape with a hollow center. A center axis of the chamber 1 is vertically arranged. The raw material gas introduction pipe 4 and the first discharge pipe 3 are arranged under the vacuum chamber 1. The raw material gas 11 is introduced in the vacuum chamber 1 through the raw material gas introduction pipe 4. A residual raw material gas out of the introduced raw material gas 11, which is not used for the crystal growth of the SiC single crystal, is discharged through the first discharge pipe 3. The raw material gas 11 may be visualized by equipment, and, in FIG. 3, the flow of the raw material gas 11 is shown by an arrow.

The heat coil 2 is arranged to surround the outside of the vacuum chamber 1 such that multiple ring parts of the coil 2 surround the chamber 1. The coil 2 includes an upper coil 2*a* and a lower coil 2*b*. The upper coil 2*a* heats the vicinity of the reaction chamber 10, and the lower coil 2*b* heats the vicinity of the raw material gas heat chamber 8. The heat coil 2 is formed of, for example, a high frequency induction coil (i.e., RF coil).

The first heat insulating member 6 is made of, for example carbon. The first heat insulating member 6 has a cylindrical shape with a hollow center and a bottom. A large opening of the member 6 faces the downward in the vertical direction. The second heat insulating member 7, the raw material gas heat chamber 8, the second discharge pipe 9 and the reaction chamber 10 are arranged in the hollow center of the first heat insulating member 6. A small opening 6*a* is formed on the bottom at the center of the first heat insulating member 6. A pulling shaft 10*c* for pulling up the reaction chamber 10 is inserted in the small opening 6*a*.

The second heat insulating member 7 is made of, for example, carbon. The member 7 has a cylindrical shape with a hollow center 7*a*. The raw material gas introduction pipe 4 is connected to the hollow center 7*a*. Thus, the hollow center 7*a* of the second heat insulating member 7 functions as an introduction passage for the raw material gas. The raw material gas 11 introduced from the raw material gas introduction pipe 4 is supplied to the reaction chamber 10 through the hollow center 7*a* of the second heat insulating member 7.

The raw material gas heat chamber 8 is made of, for example, carbon. The chamber 8 has a cylindrical shape with a bottom 8*a*. An opening 8*b* is formed on the bottom 8*a* of the chamber 8. The bottom 8*a* contacts the second heat insulating member 7 so that the opening 8*b* is connected to the hollow center 7*a* of the second heat insulating member 7. Multiple holes 8*d*, e.g., four holes 8*d* in FIG. 1 are formed on the first sidewall 8*c* of the chamber 8. The holes 8*d* are arranged at predetermined intervals. The holes 8*d* are disposed over the bottom 8*a* by a predetermined distance between the bottom 8*a* and each hole 8*d*. A branch passage 9*a* of the second discharge pipe 9 is inserted in the hole 8*d*. The raw material gas heat chamber 8 may be formed of one body. Alternatively, the chamber 8 may be formed of multiple parts so that the pipe 9 is easily inserted in the hole 8*d*.

Figure 2:
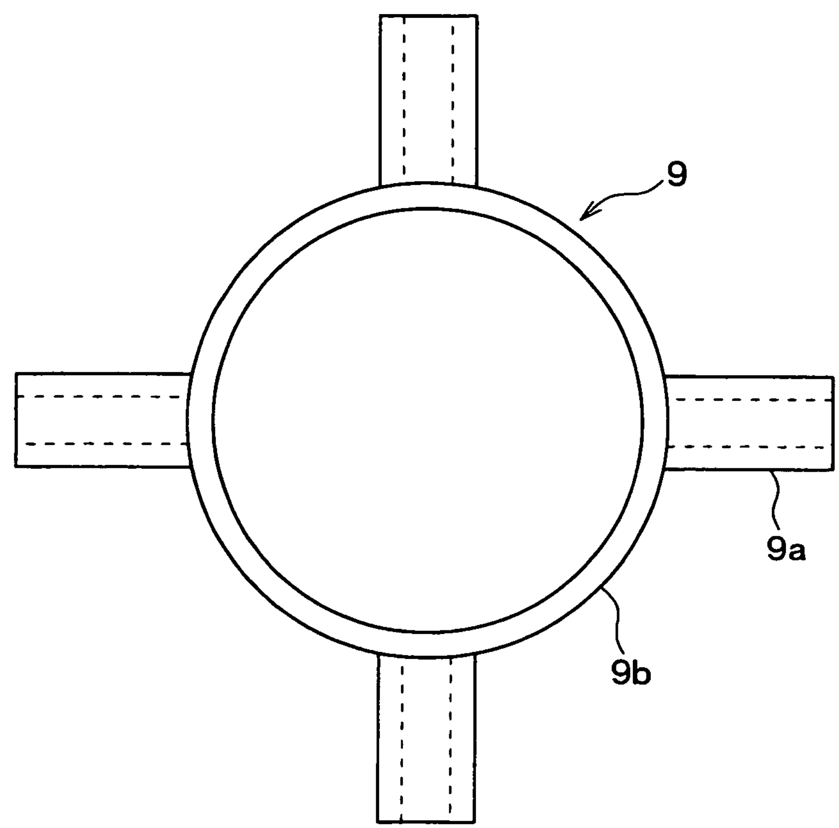
FIG. 2 is a diagram illustrating a top view of a discharge pipe in the device.

The second discharge pipe 9 is made of, for example, carbon. The pipe 9 has a cylindrical shape with a hollow center. In this embodiment, the pipe 9 has a bottom. The center axis of the pipe 9 is concentrically arranged on the center axis of the raw material gas heat chamber 8. The discharge pipe 9 is disposed around the center of the chamber 8. FIG. 2 shows an upper view of the second discharge pipe 9.

The branch passage 9*a* is formed on the second sidewall 9*b* of the second discharge pipe 9 and is disposed near the bottom of the passage 9*a*. The branch passage 9*a* protrudes from the second sidewall 9*b* along a radial direction. The branch passage 9*a* includes multiple passages, e.g., four passages in FIG. 1, which are arranged at predetermined intervals. Each branch passage 9*a* has a cylindrical shape. The dimension of the passage 9*a* is equal to the hole 8*d* on the sidewall 8*c* of the chamber 8. Each branch passage 9*a* is inserted in the hole 8*d*. Accordingly, substantially no clearance is formed between the hole 8*d* and the branch passage 9*a* so that the raw material gas does not leak from the clearance between the hole 8*d* and the passage 9*a*.

The outer diameter of the sidewall 9*b* of the pipe 9 is smaller than the inner diameter of the sidewall 8*c* of the chamber 8, so that the raw material gas 11 flows through a clearance as a raw material gas supply passage 12 between the sidewall 9*b* of the pipe 9 and the sidewall 8*c* of the chamber 8.

The reaction chamber 10 is made of, for example carbon. Preferably, the surface of the reaction chamber 10 may be covered with a film made of carbon tantalum to protect from reaction between the raw material gas and the surface of the chamber 10. The chamber 10 has a cylindrical shape with a bottom. An opening of the chamber 10 faces the raw material gas heat chamber 8. The raw material gas heat chamber 8 is disposed in the opening of the chamber 10. The inner surface of the sidewall 10*a* of the reaction chamber 10 contacts the outer surface of the sidewall 8*c* of the raw material gas heat chamber 8 without clearance. The thickness of each part of the reaction chamber 10 is, for example, 5 mm so that the heat from the reaction chamber 10 causes to heat and decompose the raw material gas 11.

The SiC single crystal substrate 13 is attached to the bottom 10*b* of the reaction chamber 10. The substrate 13 functions as a seed crystal, and has dimensions substantially equal to the inner diameter of the reaction chamber 10. The SiC single crystal ingot 14 is grown on the surface of the substrate 13. Further, the pulling shaft 10 is connected to the backside of the bottom 10*b* of the reaction chamber 10. The reaction chamber 10 is pulled up by the shaft 10*c*. By pulling up the reaction chamber 10 with the pulling shaft 10*c*, the height of the growth surface of the ingot 14 from the bottom of the second discharge pipe 9 is kept constant. Specifically, the distance between the growth surface of the ingot 14 and the raw material gas heat chamber 8 or the second discharge pipe 9 is maintained constant. Thus, the ingot 14 having a large length is grown. The distance between the growth surface of the ingot 14 and the raw material gas heat chamber 8 or the second discharge pipe 9 is, for example, in a range between zero and 50 mm. Preferably, the distance may be in a range between 5 mm and 20 mm. When the distance is smaller than 5 mm, the flow speed of the raw material gas 11 becomes large, so that crystal defect may be generated in the ingot 14. When the distance is larger than 20 mm, the growth rate of the SiC single crystal becomes small, and it is difficult for the raw material gas to reach the surface of the ingot 14.

The method for manufacturing the SiC single crystal with using the device shown in FIG. 1 will be explained as follows.

First, the substrate 13 is arranged on the surface of the bottom 10*b* of the reaction chamber 10. The raw material gas 11 including Si based gas and carbon based gas is introduced in the vacuum chamber 1. For example, a mixed gas of a silane gas including Si, a propane gas including carbon and a carrier gas is introduced in the chamber 1. The mixed gas has a predetermined mixing ratio among the silane gas, the propane gas and the carrier gas. The flow rate of the raw material gas is controlled by a mass flow controller (not shown).

Thus, the raw material gas introduced from the raw material gas introduction pipe 4 passes through the hollow center 7*a* of the second heat insulating member 7, the opening 8*b* of the raw material gas heat chamber 8, the inside of the raw material gas heat chamber 8, and the clearance between the bottom 8*a* and the sidewall 8*c* of the raw material gas heat chamber 8 and the second discharge pipe 9, and then, the gas reaches the surface of the substrate 13, which is bonded to the reaction chamber 10. When the lower coil 2*b* is energized, the raw material gas heat chamber 8 is heated so that the raw material gas is heated to a predetermined temperature. Thus, the heated gas is supplied to the surface of the substrate 13.

When the upper coil 2*a* is energized, the substrate 13 is heated to be a predetermined temperature that is lower than the heated raw material gas. Then, the ingot 14 is grown on the surface of the substrate 13. The residual gas, which is not consumed in the crystal growth of the ingot 14, is discharged to the outside of the vacuum chamber 1 through the opening of the second discharge pipe 9, the branch passage 9*a*, the clearance between the first heat insulating member 6 and the second heat insulating member 7, and the first discharge pipe 3.

Then, the reaction chamber 10, the SiC single crystal substrate 13 and the SiC single crystal ingot 14 are pulled up by the pulling shaft 10*c* with a pulling speed equal to a growth speed of the ingot 14. Thus, the height of the growth surface of the ingot 14 from the bottom of the second discharge pipe 9 is kept constant. Specifically, the distance between the growth surface of the ingot 14 and the raw material gas heat chamber 8 or the second discharge pipe 9 is maintained constant. Thus, the ingot 14 having a large length is grown.

When the ingot 14 is formed, the second discharge pipe 9 is mounted in the raw material gas heat chamber 8 so that the raw material gas 11 is supplied to the growth surface of the ingot 14 through the raw material gas heat chamber 8. Thus, the raw material gas is supplied to the substrate 13 though an utmost outer side in the hollow center of the chamber 8. Further, since the residual gas is discharged through the second discharge pipe 9 in the chamber 8, the raw material gas flows from the outer side of the reaction chamber 10 to an inner side of the chamber 10. Specifically, the gas flows from the outer side apart from the center toward the center of the chamber 10.

The raw material gas 11 is supplied to a large area of the growth surface of the ingot 14. Specifically, the gas reaches from the outer periphery of the growth surface to the center of the growth surface of the ingot 14. Thus, the diameter of the ingot 14 becomes large, so that the product yield of the SiC single crystal is improved.

Since the gas flows from the outer periphery of the chamber 10 to the center of the chamber 10, the gas is supplied to the large area of the growth surface of the ingot 14. The diameter of the ingot 14 becomes large, and therefore, the product yield of the ingot 14 is improved.

(Modifications)

The second discharge pipe 9 is arranged in the chamber 8, and the second discharge pipe 9 includes the branch passage 9*a*, so that the residual gas is discharged through the first discharge pipe 3, which is disposed on the outer side of the vacuum chamber 1. Alternatively, the residual gas may be discharged through another pipe as long as the raw material gas 11 in the reaction chamber 10 flows from the outer side to the center of the chamber 10.

The chamber 8 has the cylindrical shape with the bottom 8*a*. Alternatively, the chamber 8 may have a cylindrical shape without a bottom so that the chamber 8 may have a hollow center composed of the sidewall 8*c* only. The second heat insulating member 7 is arranged from the raw material gas introduction pipe 4 to the raw material gas heat chamber 8. Alternatively, the chamber 8 may be extended toward the raw material gas introduction pipe 4 so that the chamber 8 is integrated with the second heat insulating member 7.

The above disclosure has the following aspects.

According to a first aspect of the present disclosure, a device for manufacturing a SiC single crystal includes: a raw material gas introduction pipe introducing a raw material gas, which provides crystal growth of the SiC single crystal; a raw material gas heat chamber having a cylindrical shape with a hollow center, wherein the hollow center of the raw material gas heat chamber provides a raw material gas supply passage, the cylindrical shape of the raw material gas heat chamber provides a first sidewall, the raw material gas supply passage flows the raw material gas introduced from the raw material gas introduction pipe, and the raw material gas heat chamber heats the raw material gas when the raw material gas flows through the raw material gas supply passage; a reaction chamber having a cylindrical shape with a bottom, wherein the cylindrical shape of the reaction chamber provides a second sidewall, an inner surface of the second sidewall contacts an outer surface of the first sidewall so that the bottom of the reaction chamber is disposed opposite to the raw material gas heat chamber, and a SiC single crystal substrate as a seed crystal is arranged on the bottom of the reaction chamber so that the raw material gas heated by the raw material gas heat chamber is supplied to the SiC single crystal substrate; and a discharge pipe disposed in the hollow center of the raw material gas heat chamber. The raw material gas supply passage is disposed between an outer surface of the discharge pipe and an inner surface of the first sidewall, and the discharge pipe discharges a residual gas of the raw material gas, which is not used for the crystal growth of the SiC single crystal.

Since the discharge pipe is arranged in the raw material gas heat chamber, the raw material gas flows from an outer side of the reaction chamber to a center of the reaction chamber. Thus, the raw material gas is supplied in a large area of a growth surface of a SiC single crystal ingot. The ingot has a large diameter, and the product yield of the ingot is improved.

Alternatively, the device may further include a pull-up shaft pulling up the reaction chamber so that a distance between the reaction chamber and the raw material gas heat chamber is changed. In this case, the height of the growth surface of the ingot is maintained constant.

Alternatively, the discharge pipe may have a cylindrical shape with a bottom. The cylindrical shape of the discharge pipe provides a third sidewall. The discharge pipe further includes a branch passage, which protrudes from the third sidewall in a radial direction of the cylindrical shape. The first sidewall includes a hole, in which the branch passage is inserted without a clearance between the first sidewall and the branch passage, and the residual gas is discharged to an outside of the raw material gas heat chamber through the branch passage. Further, the discharge pipe may further include an opening, which faces the SiC single crystal substrate, and the bottom of the discharge pipe faces the raw material gas introduction pipe. The raw material gas flows from an outer periphery of the SiC single crystal substrate to a center of the SiC single crystal substrate. The cylindrical shape of the raw material gas heat chamber has a bottom with an opening, and the raw material gas introduction pipe is inserted in the opening of the raw material gas heat chamber without a clearance between the raw material gas introduction pipe and the raw material gas heat chamber. Furthermore, a distance between an end of the raw material gas heat chamber and a growth surface of the SiC single crystal may be in a range between 5 mm and 20 mm.

According to a second aspect of the present disclosure, a method for manufacturing a SiC single crystal includes: preparing a raw material gas heat chamber having a cylindrical shape with a hollow center, wherein the hollow center of the raw material gas heat chamber provides a raw material gas supply passage, and the cylindrical shape of the raw material gas heat chamber provides a first sidewall; arranging a reaction chamber over the raw material gas heat chamber, wherein the reaction chamber has a cylindrical shape with a bottom, and the cylindrical shape of the reaction chamber provides a second sidewall; contacting an inner surface of the second sidewall on an outer surface of the first sidewall so that the bottom of the reaction chamber is disposed opposite to the raw material gas heat chamber; arranging a SiC single crystal substrate as a seed crystal on the bottom of the reaction chamber; arranging a discharge pipe in the hollow center of the raw material gas heat chamber, wherein the raw material gas supply passage is disposed between an outer surface of the discharge pipe and an inner surface of the first sidewall; heating a raw material gas with the raw material gas heat chamber when the raw material gas flows through the raw material gas supply passage, wherein the raw material gas provides crystal growth of the SiC single crystal; supplying the raw material gas to the SiC single crystal substrate through the raw material gas supply passage so that a SiC single crystal ingot is formed on the SiC single crystal substrate; and discharging a residual gas of the raw material gas through the discharge pipe, the residual gas which is not used for the crystal growth of the SiC single crystal. The raw material gas flows from an outer periphery of the SiC single crystal substrate to a center of the SiC single crystal substrate.

In the above method, the raw material gas flows from an outer side of the reaction chamber to a center of the reaction chamber. Thus, the raw material gas is supplied in a large area of a growth surface of a SiC single crystal ingot. The ingot has a large diameter, and the product yield of the ingot is improved.

Alternatively, the method may further include: pulling up the reaction chamber together with the SiC single crystal substrate, and controlling a distance between an upper end of the raw material gas heat chamber and a surface of the SiC single crystal ingot in a range between 0 mm and 50 mm. Further, the distance may be controlled in a range between 5 mm and 20 mm.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A device for manufacturing a SiC single crystal comprising:

a raw material gas introduction pipe introducing a raw material gas, which provides crystal growth of the SiC single crystal;

a raw material gas heat chamber having a cylindrical shape with a hollow center, wherein the hollow center of the raw material gas heat chamber provides a raw material gas supply passage, the cylindrical shape of the raw material gas heat chamber provides a first sidewall, the raw material gas supply passage flows the raw material gas introduced from the raw material gas introduction pipe, and the raw material gas heat chamber heats the raw material gas when the raw material gas flows through the raw material gas supply passage;

a reaction chamber having a cylindrical shape with a bottom, wherein the cylindrical shape of the reaction chamber provides a second sidewall, an inner surface of the second sidewall contacts an outer surface of the first sidewall so that the bottom of the reaction chamber is disposed opposite to the raw material gas heat chamber, and a SiC single crystal substrate as a seed crystal is arranged on the bottom of the reaction chamber so that the raw material gas heated by the raw material gas heat chamber is supplied to the SiC single crystal substrate; and a discharge pipe disposed in the hollow center of the raw material gas heat chamber, wherein the raw material gas supply passage is disposed between an outer surface of the discharge pipe and an inner surface of the first sidewall, wherein the raw material gas supply passage supplies the raw material gas to the reaction chamber opposite an outer periphery of the SiC single crystal substrate, wherein the discharge pipe evacuates a residual gas of the raw material gas, which is not used for the crystal growth of the SiC single crystal from the reaction chamber at a point opposite the center of the SiC single crystal substrate, wherein the discharge pipe has a cylindrical shape with a bottom and an input opening, the input opening being positioned opposite the center of the SiC single crystal substrate, wherein the cylindrical shape of the discharge pipe provides a third sidewall, wherein an outer diameter of the third sidewall is smaller than an inner diameter of the first sidewall, and wherein the outer diameter of the third sidewall is smaller than a radial dimension of the SiC single crystal substrate.

2. The device according to claim 1, further comprising:

a pull-up shaft pulling up the reaction chamber so that a distance between the reaction chamber and the raw material gas heat chamber is changed.

3. The device according to claim 1, wherein the discharge pipe further includes a branch passage, which protrudes from the third sidewall in a radial direction of the cylindrical shape, wherein the first sidewall includes a hole, in which the branch passage is inserted without a clearance between the first sidewall and the branch passage, and wherein the residual gas is evacuated from the reaction chamber to an outside of the raw material gas heat chamber from the center of the SiC single crystal substrate, through the input opening, through the cylindrical shape, and through the branch passage.

4. The device according to claim 3, wherein the bottom of the discharge pipe faces the raw material gas introduction pipe, wherein the raw material gas flows from an outer periphery of the SiC single crystal substrate to the center of the SiC single crystal substrate, wherein the cylindrical shape of the raw material gas heat chamber has a bottom with an opening, and wherein the raw material gas introduction pipe is inserted in the opening of the raw material gas heat chamber without a clearance between the raw material gas introduction pipe and the raw material gas heat chamber.

5. The device according to claim 4, wherein a distance between an end of the raw material gas heat chamber and a growth surface of the SiC single crystal is in a range between 5 mm and 20 mm.

6. A device for manufacturing a SiC single crystal comprising:

a raw material gas introduction pipe introducing a raw material gas, which provides crystal growth of the SiC single crystal;

a raw material gas heat chamber having a cylindrical shape with a hollow center, wherein the cylindrical shape of the raw material gas heat chamber provides a first sidewall;

a reaction chamber having a cylindrical shape with a bottom, wherein the cylindrical shape of the reaction chamber provides a second sidewall, an inner surface of the second sidewall contacts an outer surface of the first sidewall so that the bottom of the reaction chamber is disposed opposite to the raw material gas heat chamber, and a SiC single crystal substrate as a seed crystal is arranged on the bottom of the reaction chamber; and a discharge pipe, having a cylindrical shape with a bottom and an input opening, disposed in the hollow center of the raw material gas heat chamber, the input opening being located opposite a center of the SiC single crystal substrate, and one or more branch passages of the discharge pipe being formed to pass through the first sidewall of the raw material gas heat chamber, wherein a raw material gas supply passage is disposed between an outer surface of the discharge pipe and an inner surface of the first sidewall, and under the discharge pipe, wherein the discharge pipe provides a third sidewall, an outer diameter of the third sidewall being smaller than an inner diameter of the first sidewall, and an outer diameter of the third sidewall being smaller than a radial dimension of the SiC single crystal substrate, wherein the raw material gas supply passage flows the raw material gas introduced from the raw material gas introduction pipe, wherein the raw material gas heat chamber heats the raw material gas when the raw material gas flows through the raw material gas supply passage, wherein an input opening of the raw material gas supply passage is connected to the raw material gas introduction pipe, and an output opening of the raw material gas supply passage is located opposite an outer periphery of the SiC single crystal substrate, wherein the raw material gas supply passage supplies the raw material gas to the reaction chamber opposite an outer periphery of the SiC single crystal substrate, and wherein the discharge pipe is configured to evacuate a residual gas of the raw material gas, which is not used for the crystal growth of the SiC single crystal, from the reaction chamber at a point opposite the center of the SiC single crystal substrate via the input opening of the discharge pipe to the branch passages of the discharge pipe.

7. The device according to claim 6, further comprising:

a pull-up shaft pulling up the reaction chamber so that a distance between the reaction chamber and the raw material gas heat chamber is changed.

8. The device according to claim 6, wherein the first sidewall includes a hole, in which one of the branch passages is inserted without a clearance between the first sidewall and the branch passage.

9. The device according to claim 8, wherein the bottom of the discharge pipe faces the raw material gas introduction pipe, wherein the raw material gas flows from an outer periphery of the SiC single crystal substrate to a center of the SiC single crystal substrate, wherein the cylindrical shape of the raw material gas heat chamber has a bottom with an opening, and wherein the raw material gas introduction pipe is inserted in the opening of the raw material gas heat chamber without a clearance between the raw material gas introduction pipe and the raw material gas heat chamber.

10. The device according to claim 9, wherein a distance between an end of the raw material gas heat chamber and a growth surface of the SiC single crystal is in a range between 5 mm and 20 mm.

* * * * *